United States Patent
Cooper et al.

(10) Patent No.: US 7,537,709 B2
(45) Date of Patent: May 26, 2009

(54) METHOD FOR ISOTROPIC ETCHING OF COPPER

(75) Inventors: Emanuel I. Cooper, Scarsdale, NY (US); Bruce Furman, Poughquag, NY (US); David L. Rath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 11/401,898

(22) Filed: Apr. 12, 2006

(65) Prior Publication Data

US 2006/0183056 A1    Aug. 17, 2006

Related U.S. Application Data

(62) Division of application No. 10/664,017, filed on Sep. 17, 2003, now Pat. No. 7,056,648.

(51) Int. Cl.
*C09K 13/00* (2006.01)
(52) U.S. Cl. .................... 252/79.1; 438/745
(58) Field of Classification Search .............. 438/745; 252/9.1–79.57; 134/1.1, 1.2, 1.3, 2, 3
See application file for complete search history.

(56) References Cited

U.S. PATENT DOCUMENTS

| | | | |
|---|---|---|---|
| 3,809,588 A | | 5/1974 | Zeblisky |
| 4,349,411 A | * | 9/1982 | Okinaka ............... 216/22 |
| 5,328,561 A | * | 7/1994 | Letize et al. ............ 216/13 |
| 6,191,085 B1 | | 2/2001 | Cooper et al. |
| 6,194,317 B1 | * | 2/2001 | Kaisaki et al. ........... 438/692 |
| 6,261,953 B1 | * | 7/2001 | Uozumi ................ 438/687 |
| 6,475,909 B2 | | 11/2002 | Uozumi |
| 6,537,381 B1 | * | 3/2003 | Mikhaylich et al. ........ 134/6 |
| 6,635,186 B1 | * | 10/2003 | Small et al. ............. 216/88 |
| 6,787,480 B2 | * | 9/2004 | Aoki et al. ............. 438/775 |
| 2001/0013617 A1 | * | 8/2001 | Toyoda et al. ............ 257/301 |
| 2005/0001325 A1 | * | 1/2005 | Andricacos et al. ........ 257/762 |

* cited by examiner

*Primary Examiner*—Kin-Chan Chen
(74) *Attorney, Agent, or Firm*—Connolly Bove Lodge & Hutz LLP; Robert M. Trepp, Esq.

(57) ABSTRACT

Copper and copper alloys are etched to provide uniform and smooth surface by employing an aqueous composition that comprises an oxidant, a mixture of at least one weak complexant and at least one strong complexant for the copper or copper alloy, and water and has a pH of about 6 to about 12 so as to form an oxidized etch controlling layer and to uniformly remove the copper or copper alloy; and then removing the oxidized etch controlling layer with a non-oxidizing composition. Copper and copper alloy structure, having smooth upper surfaces are also provided.

12 Claims, 8 Drawing Sheets

METHOD FOR ISOTROPIC ETCHING OF COPPER

This application is a Divisional of U.S. application Ser. No. 10/664,017 filed Sep. 17, 2003, and now U.S. Pat No. 7,056,648.

DESCRIPTION

1. Technical Field

The present invention relates to a process for etching copper and copper alloys, and particularly isotropic etching to provide uniform and smooth copper surfaces. The present invention is also concerned with copper or alloy structures exhibiting uniform and smooth copper surfaces.

2. Background of the Invention

In the fabrication of thin film wiring for electronic applications, it is often required to etch polycrystalline copper surfaces. Any roughening of this surface can cause significant process or electrical variability to the structures. Current etchants show significant surface roughening, as well as dependence of etching rates on feature density, size, electrical connectivity, and location on the wafer. In particular, commonly used copper etchants, such as acid solutions of peroxide or persulfate, tend to preferentially etch the copper in the immediate proximity of grain boundaries. In addition, different exposed crystal faces tend to etch at different rates.

Numerous applications in semiconductor fabrication would benefit from being able to provide smooth, sub-micron recess etching of copper and copper alloys. Some applications in semiconductor fabrication that would benefit for such a process include:

(1) Selective capping in advanced CMOS devices: to decrease the effective dielectric constant of the intralayer insulator, and also to increase the strength of the via-to-line junctions.

(2) Post-CMP (chemical mechanical polishing) clean for copper Dual Damascene builds: to suppress dendrite growth for increased reliability, and to remove copper residues on dielectric to decrease current leakage and increase shorts yield. Although commercial cleaning solutions exist for this, these are usually extremely costly.

(3) Anchored vias (inverted mushroom): to increase mechanical strength of via structure.

(4) Post-CMP cleanup for FBEOL selective (Ni, Au) plating on copper—maskless technology, whereby the processing does not roughen the copper seed layer in the features where the subsequent plating will be done, while allowing the complete removal of copper left from the CMP process from the top surfaces.

(5) Post-CMP cleanup for deep via selective Cu plating—system on a chip.

Accordingly, a great need exists for providing a process for isotropic, smooth sub-micron etching of copper and copper alloys.

SUMMARY OF INVENTION

The present invention addresses problems in the prior art and provides a process that is capable of isotropically etching copper and copper alloys to produce smooth copper and copper alloy surfaces.

In particular, one aspect of the present invention is directed to a process for etching copper and copper alloys which comprises:

(a) contacting an exposed copper or copper alloy surface with an aqueous etching composition that comprises an oxidant, a mixture of at least one weak complexant and at least one strong complexant for the copper or copper alloy, and water and has a pH of about 6 to about 12 so as to form an oxidized etch controlling layer of a copper compound and to remove the copper or copper alloy; and (b) then contacting the structure with a non-oxidizing composition for removing the oxidized etch controlling layer.

The present invention is also concerned with an etched copper or copper alloy surface obtained by the above process.

A further aspect of the present invention is concerned with a process for generating copper or copper alloy electrical interconnects or contact pads which comprises:

a. depositing a blanket copper or copper alloy film on a dielectric substrate:

b. depositing a thin film or photoresist over the copper or copper alloy film, c. exposing and developing the photoresist through a mask designed to generate the negative image of the desired copper or copper alloy pattern;

d. etching away the copper or copper alloy exposed in c by the above disclosed process; and e. stripping the resist to reveal the desired copper or copper alloy pattern.

Another aspect of the present invention relates to a copper structure comprising a copper or copper alloy surface with an oxidized etch controlling layer having a uniform thickness of at least about 0.5 nanometers and more typically about 5 nanometers to about 1000 nanometers adhered to the copper or copper alloy surface.

A still further aspect of the present invention is concerned with a dielectric-copper or copper alloy structure comprising copper or alloy thereof being uniformly recessed relative to the top of surrounding dielectric material and having an upper surface with an average roughness of 3 nanometers or less.

The present invention also relates to an aqueous etching composition that comprises an oxidant, a mixture of at least one weak complexant and at least one strong complexant for the copper or copper alloy, and water and has a pH of about 6 to about 12.

Other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
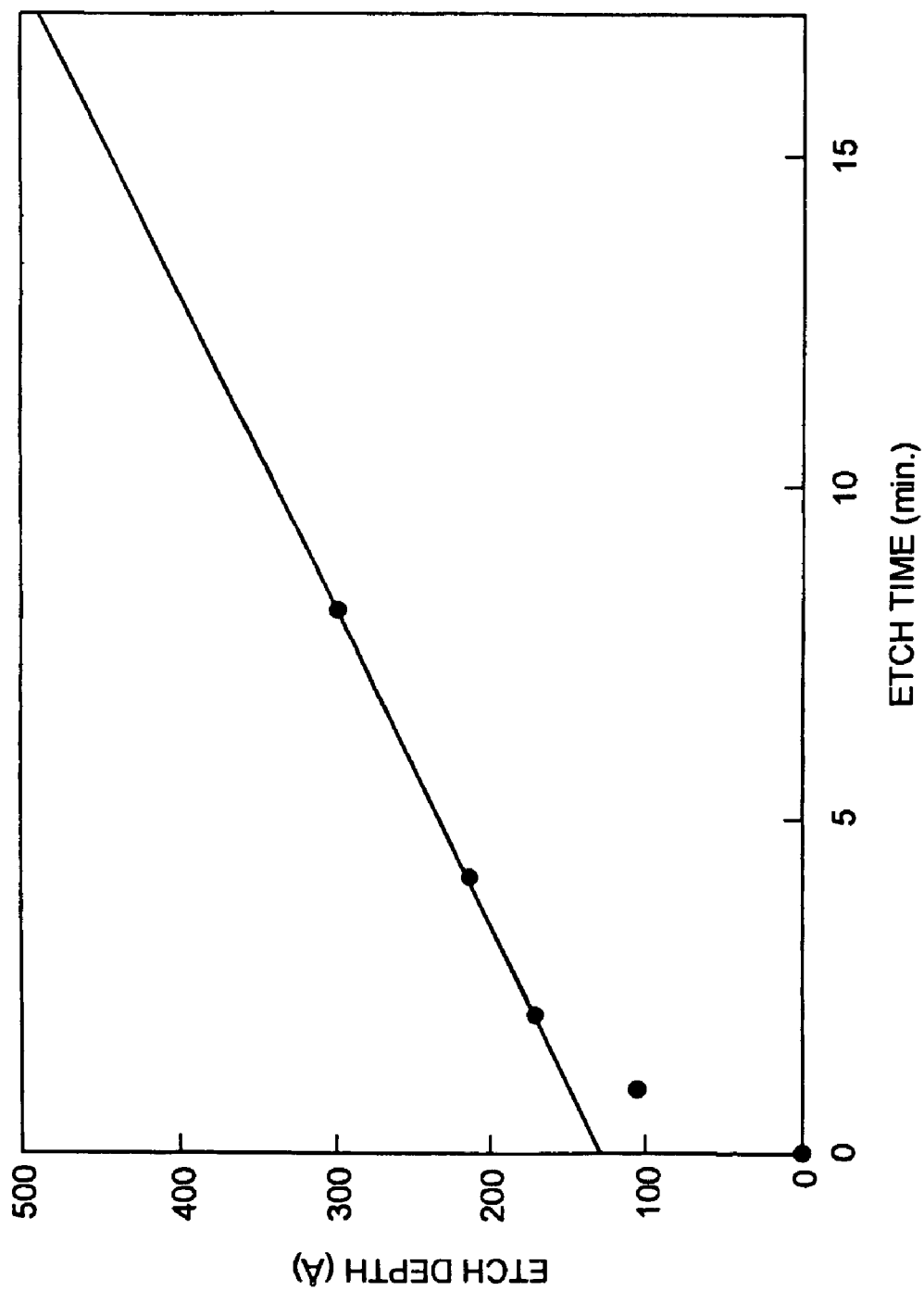
FIGS. 1 and 2 illustrate etch depth as a function of time for compositions according to the present invention.

According to the present invention, copper and copper alloys are contacted with an aqueous etching composition that comprises an oxidant, a mixture of at least one weak complexant and at least one strong complexant for the copper or copper alloy and water and has a pH of about 6 to about 12 so as to form an oxidized etch controlling layer of a copper compound and to remove the copper or copper alloy. The use of the etchant of the present invention makes possible the uniform removal of the copper or copper alloy.

Suitable oxidants include peroxide such as hydrogen peroxide, peroxy carboxylate, perborate, and percarbonate. Mixtures of oxidants can be employed, if desired.

The preferred oxidant is hydrogen peroxide. The amount of oxidant is typically about 0.05 wt % to about 10 wt % and preferably about 2 wt % to about 4 wt %.

The weak complexant typically has a cumulative stability constant with copper of $\leq 10^{14}$. Examples of weak complexants for copper and copper alloys are ammonia; amines such as ethylamine, methylamine, tetramethylammonium hydroxide and 2-hydroxyethyl-trimethylammonium hydroxide.

The strong complexant typically has a cumulative stability constant with copper of $\geq 10^{15}$. Examples of strong complexants for copper and copper alloys are aminocarboxylates and aminophosphonates, and more specifically, 1,2-cyclohexane diaminetetraacetic acid (CDTA), ethylene diamine tetraacetic acid (EDTA), triethylenetetraaminehexaacetic acid; diethylene triaminepentaacetic acid;, 2,2-dimethyl-1,3-diaminopropane-N,N,N',N'-tetraacetic acid; cis, cis,cis-3,5-dimethyl-1,2-diaminocyclopentane-N,N,N',N'-tetraacetic acid and cis-bicyclo (2.2.2) octane-2,3-diamine-N,N,N',N'-tetraacetic acid.

The preferred weak complexant is ammonia, typically added as a concentrated ammonium hydroxide solution.

The Molar concentration of the weak complexant is typically about 0.1 Molar to about 0.8 Molar and preferably about 0.2 Molar to about 0.4 Molar.

The preferred strong complexants are CDTA (see U.S. Pat. No. 6,121,085) and DTPMP (H. Saloniemi & al., 200$^{th}$ ECS meeting extended abstracts, 2001), due to their stability against oxidation by peroxide, and EDTA, with CDTA and DTPMP being most preferred. The strong complexant is typically present in amounts of about 0.001 to about 10 g/l.

According to more preferred aspects of the present invention, the complexant comprises ammonia along with CDTA or EDTA which act as stabilizers.

The use of a combination of both the weak complexant and strong complexant makes possible a relatively steady state regime of continuous inhibiting formation and dissolution. It is believed that the presence of the strong complexant insures a continuous slow dissolution of the inhibiting layer, which in turn makes possible to avoid a multiple etching step process for dissolving the inhibiting layer and then contacting the structure again with the etchant. The etching process of this invention can be carried out in a single etching step. On the other hand, the use of only a strong complexant, the inhibiting layer would not be adequately formed and the etching would tend to be less uniform.

The etching composition typically has a pH of about 6 to about 12 and more typically a basic pH. The pH can be adjusted to the desired level by adding a non-oxidizing acid such as sulfuric acid, acetic acid or methanesulfonic acid; or a base such as sodium hydroxide, potassium hydroxide and tetramethyl ammonium hydroxide.

A specific composition employed according to the present invention has a volume ratio of 40:2:1 v/v $H_2O$: $H_2O_2$ 30%: $NH_4OH$ 56.6% (i.e., an aqueous solution containing 1.55 wt % $H_2O_2$ and 0.57 wt % $NH_3$) and 0.05% CDTA, with the pH adjusted downward to 9.5 (by the addition of sulfuric acid), so as to ensure formation of the inhibiting layer. Another such composition has a volume ratio of 40:4:1 v/v $H_2O$:$H_2O_2$ 30%: $NH_4OH$ 56.6% (i.e., an aqueous solution containing an aqueous solution containing 2.94 wt % $H_2O_2$ and 0.54% $NH_3$) and 0.5% CDTA and a pH of approximately 10.2. In this higher-oxidant case no pH adjustment is necessary for the formation of the inhibiting layer.

The component concentrations and operating temperature are judiciously selected so that contacting of the copper or copper alloy with the composition results in a uniform inhibiting or etch control layer. Dissolution of the inhibiting layer in acid generates recesses of uniform depth and smooth, flat copper surfaces.

It is believed that the inhibiting or etch control layer formed in situ is typically a hydrated copper oxide. The inhibiting layer formation then limits the diffusion of the oxidant towards the copper metal surface, and the diffusion of the copper ionic species away from the metal surface to govern the overall reaction rate. By creating this inhibiting layer the surface layer the copper or copper alloy can be selectively removed thus resulting in a very uniform etching. The copper-complexing components of the solution attack the exposed surface of the inhibiting layer and remove it at a rate which depends on their concentrations. The thickness of the inhibiting layer, and the etch rate, can be controlled by modifying the concentrations of the oxidant and the complexants, as well as the temperature.

Unlike passivation layers, such as the well known ones formed by benzotriazole (BTA), the inhibiting layer, according to the present invention, does not prevent oxidation of the metal. Instead, it modulates the oxidation process by allowing substantial diffusion of etchant toward the copper surface. Since the reaction of the oxidant with copper is very fast, the overall etching rate is controlled by diffusion of reactants and possibly reaction products through the inhibiting layer, which at a given time is of about the same thickness everywhere irrespective of copper feature size.

At the same time, electrochemical reactions of the galvanic corrosion type, which in state-of-the-art etchants etch the most active metallic copper areas (e.g., small features) selectively, are suppressed. Since diffusion through the inhibiting layer is much slower than in the liquid, effects of local hydrodynamic variations are also lessened.

The thickness of the inhibiting layer is a function of etching conditions. The layer is formed continuously at the copper-inhibiting layer interface, while also being dissolved continuously at the inhibiting layer-liquid interface. The relative rates of these two reactions determine its thickness at any given time. A typical thickness of the inhibiting layer is about 2 nanometers to about 1000 nanometers.

Generally, the etching rate increases as the pH and/or concentrations of the complexants such as ammonia and CDTA increases. On the other hand, this rate decreases as the oxidant such as peroxide content increases, in marked contrast to the etching rate by acid-peroxide mixtures. When the etch is used in a recirculating or a static tool, the presence of the stronger complexant for Cu(2+) is desirable in order to prevent Cu(2+)-catalyzed $H_2O_2$ decomposition and the resulting oxygen bubbling. This bubbling tends to cause defects.

The etching rate is also increased by increasing temperature. For example, raising the etch temperature form 25 to 65° C. increases the etch rate by a factor of 6, without negatively affecting the etch uniformity.

FIG. 1 shows the etch depth in nanometers as a function of time for a room temperature etch using a composition (composition A) having a volume ratio of 40:2:1 v/v $H_2O$: $H_2O_2$ 30%:$NH_4OH$ 56.6% (i.e., an aqueous solution containing 1.55 wt % $H_2O_2$ and 0.57 wt % $NH_3$) and 0.5 g/l CDTA and pH adjusted downward to 9.5 (by addition of sulfuric acid) so as to ensure formation of the inhibiting layer.

It is noted that the rate stabilizes after an initiation period.

Figure 2:
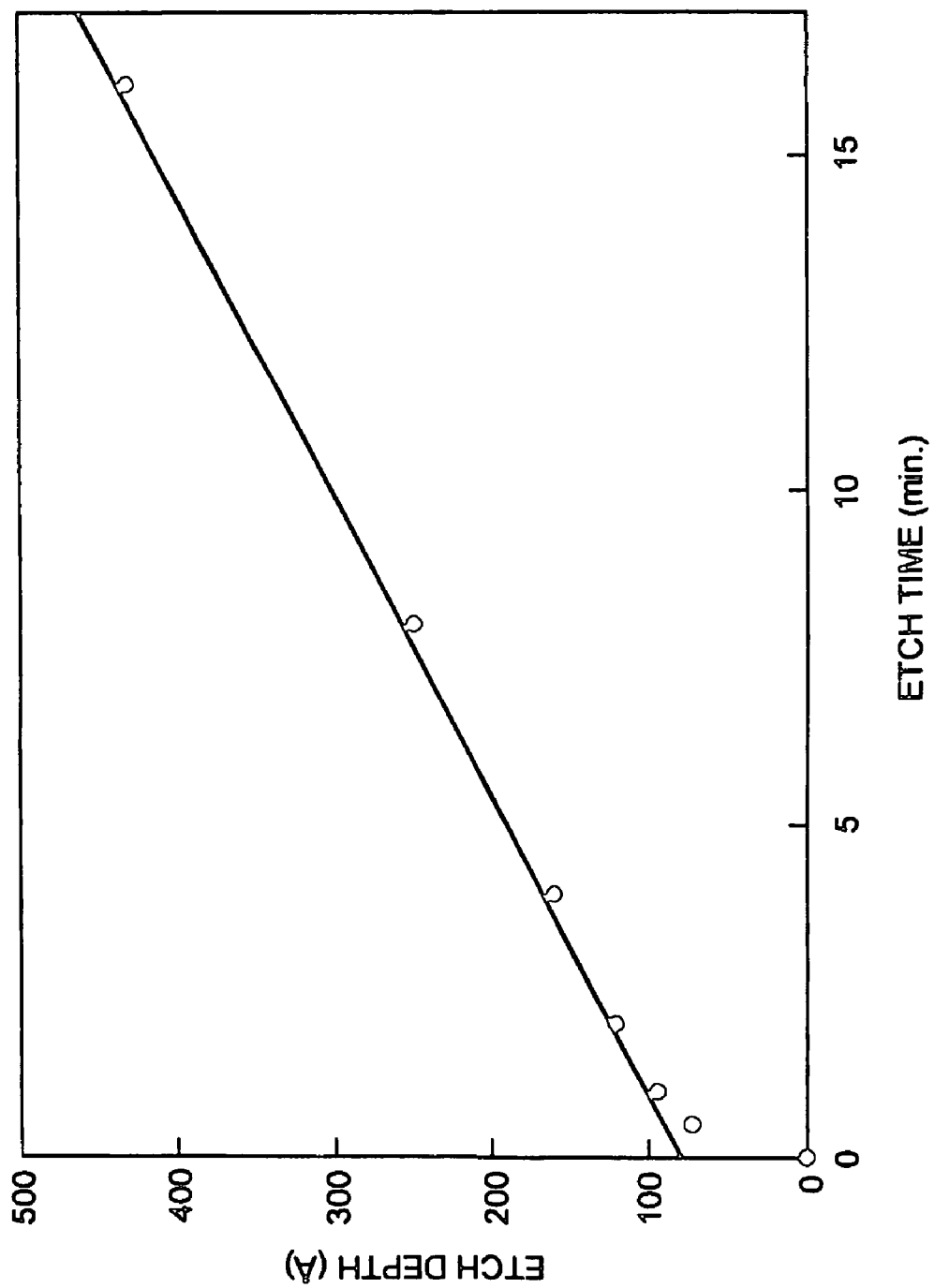
Figure 3:
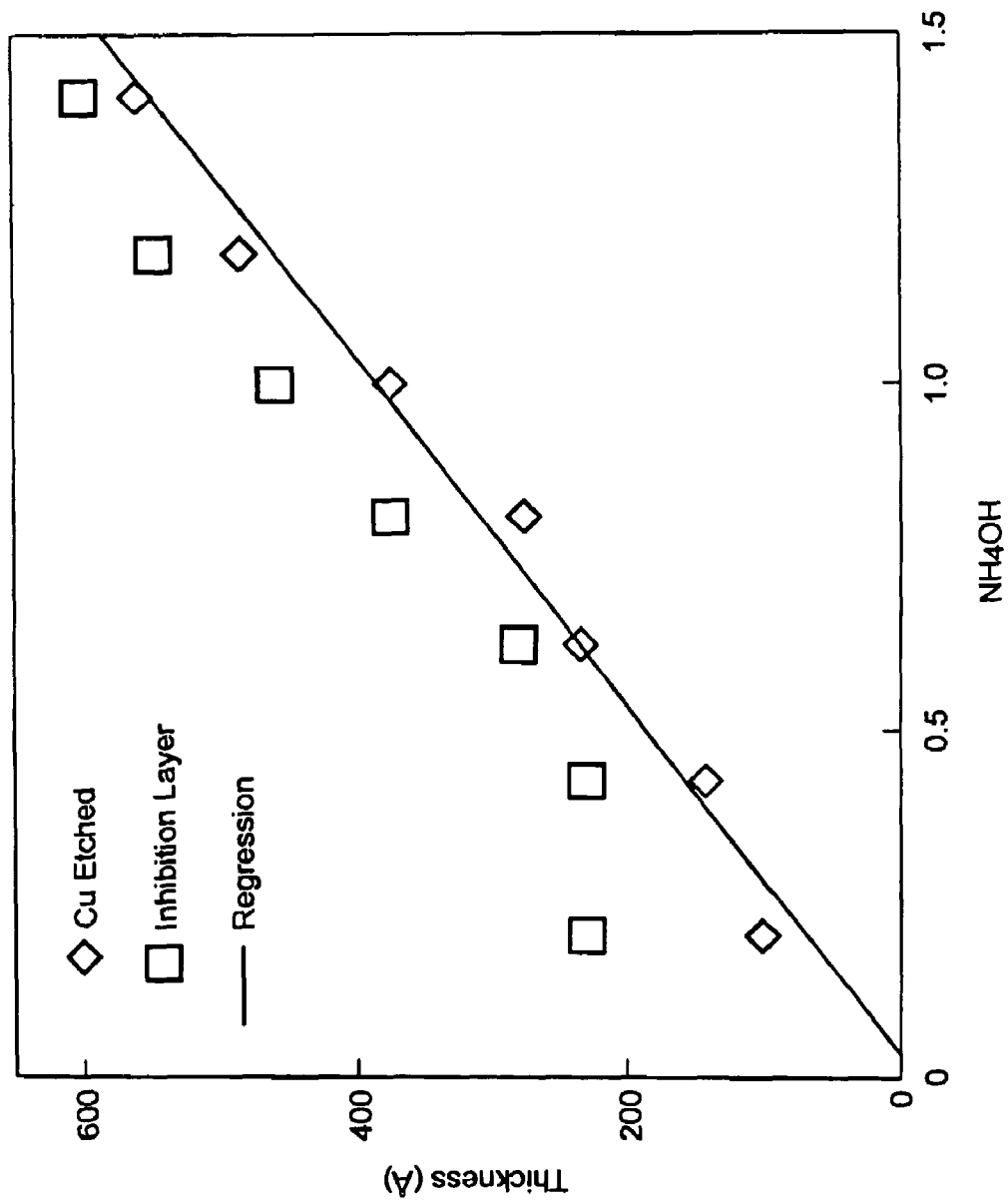
FIG. 3 illustrates etch rate as a function of peroxide/ammonia ratio.

FIG. 2 shows the etch depth in nanometers as a function of time for a room temperature etch using a composition (composition B) having a volume ratio of 40:4:1 v/v $H_2O$: $H_2O_2$ 30%: $NH_4OH$ 56.6% (i.e., an aqueous solution containing an aqueous solution containing 2.94 wt % $H_2O_2$ and 0.54% $NH_3$) and 0.5 g/l CDTA and a pH of approximately 10.2; in this higher-oxidant case no pH adjustment is necessary for the formation of the inhibiting layer. The etch rate stabilizes after the initiation period. Compared to the example shown in FIG. 1, the etch rate is slower. Etching is slower in this case, due to the higher peroxide/ammonia ratio, an effect shown in a more general way in FIG. 3. In FIG. 3, the results of 10-minute etching in 40:4:x v/v solutions (x=volume of concentrated ammonia) are displayed as a function of x. Note that, (a) the etch depth is approximately linearly dependent on ammonia concentration, and (b) the inhibition layer (measured separately in each case before removal) is in all cases thicker than the copper it replaces.

Typically, at the end of the etching process the remaining copper is covered by a substantial inhibiting layer, often as thick or thicker than the copper it has replaced. This layer needs to be removed. It is noteworthy, though, that the removal does not have to be immediate; in fact, the sample can be rinsed and dried at this stage and then stored for several days without significant effect on the eventual surface quality.

The inhibiting layer is removed by exposing the surface to a non-oxidizing solution capable of dissolving hydrous copper oxides, such as an acid solution or a solution containing a copper complexant such as glycine or imidazole. The dissolving solution is preferably deaerated so as to prevent any additional, and non-uniform, etching by dissolved oxygen. Alternatively, an acid solution, e.g., dilute sulfuric acid, that contains a corrosion inhibitor such as BTA can be used. The acid component readily dissolves the inhibiting layer, while dissolved oxygen with the BTA forms a passive film preventing oxygen-driven corrosion.

Finally, the acid can be rinsed away with deionized water, preferably deaerated, optionally followed by a water miscible solvent, and the sample can be dried by a commonly used technique (by blowing nitrogen, in a Marangoni dryer, etc.).

Typical non-oxidizing acids are sulfuric acid, hydrochloric acid, acetic acid and methanylsulfonic acid.

A typical composition used contains about 0.2 Molar acetic acid.

The present invention makes possible uniform removal of 5 nanometers to about 1000 nanometers and more typically about 10 nanometers to about 500 nanometers. For instance, examples using the in-situ formed inhibiting layer on blanket deposited copper and patterned electroplated copper, after CMP (chemical-mechanical patterning) provided:

5 nanometers attainable with a 30 second process, giving slightly reduced copper height differences at grain boundaries 15-20 nanometers etch completely removes height differences at grain boundaries;

300 nanometers etch, demonstrated on blanket electroplated copper, results in mirror finish.

Remarkably, beyond a certain minimal etch depth (20-40 nanometers) the resulting low surface roughness reaches a steady-state condition and becomes independent of the etch depth.

With respect to electrical interconnects, the main prior art challenge is to prevent self-induced galvanic corrosion. An example system is a patterned structure where a wide wire with large grains is electrically or directly connected to a narrow wire with small grains. An acid etchant applied to such a structure tends to selectively oxidize and remove copper with the highest energy. In the example structure, the wide wire could drive preferential dissolution of the narrow wire. The inhibiting layer formed by the etchant in this invention equalizes the copper surface energy, thus preventing selective corrosion.

The etching process of the present invention yields much better uniformity of etching than existing methods, both on a micro scale (between features or parts of features) and on a wafer scale. Transport through the inhibiting layer, rather than through the much thicker liquid surface diffusion layer, or through the solution bulk, defines the etching rate. Therefore, the local density of features or shape of features (at the liquid diffusion layer scale) has little effect, and the same is true for the intensity of agitation, whose lack of uniformity across the wafer often causes uneven etching in other etching processes. Various methods of agitation can be employed, with the fixtured wafer rotating in a stationary solution, stationary wafers in a stream of etching solution running in a recirculation loop, etc. However, a minimum rate of agitation is necessary to achieve uniformity. For example, when etching a 200 mm wafer in a rotating fixture inside a stationary solution, a rotation rate of at least about 30 rpm and preferably 100 rpm is advisable.

The following non-limiting examples are presented to further illustrate the present invention.

EXAMPLE 1

An interconnect copper structure, which includes a dielectric and a liner inert to the etchant and containing 1 and 0.1 micron wide wires, was first cleaned with a deaerated isopropanol/HCl mixture (25% IPA, 0.18% HCl) to remove any contaminants from the preceding CMP (chemical-mechanical polishing) step, and then was etched for about 4 minutes at room temperature in an etchant of this invention (an aqueous solution containing 2.94 wt % $H_2O_2$, 0.54% $NH_3$, and 0.05% CDTA and a pH of approximately 10.2). During the etching the sample was stationary in a beaker and the solution was stirred with a 2.5 cm magnetic stirring bar at 180 rpm. The sample was then dried in a nitrogen stream. The inhibiting layer was then removed by treating the sample for about 4 minutes with a nitrogen-deaerated 100:1 (v/v) acetic acid solution.

This example illustrates the steps of inhibiting layer formation and dissolution with respect to effects on copper recessing. See FIGS. 4, 5 and 6 which show AFM (atomic force microscope) images of the same interconnect copper structure taken after each step in the copper etching process. These figures are of the same exact area on the same sample.

Figure 4:
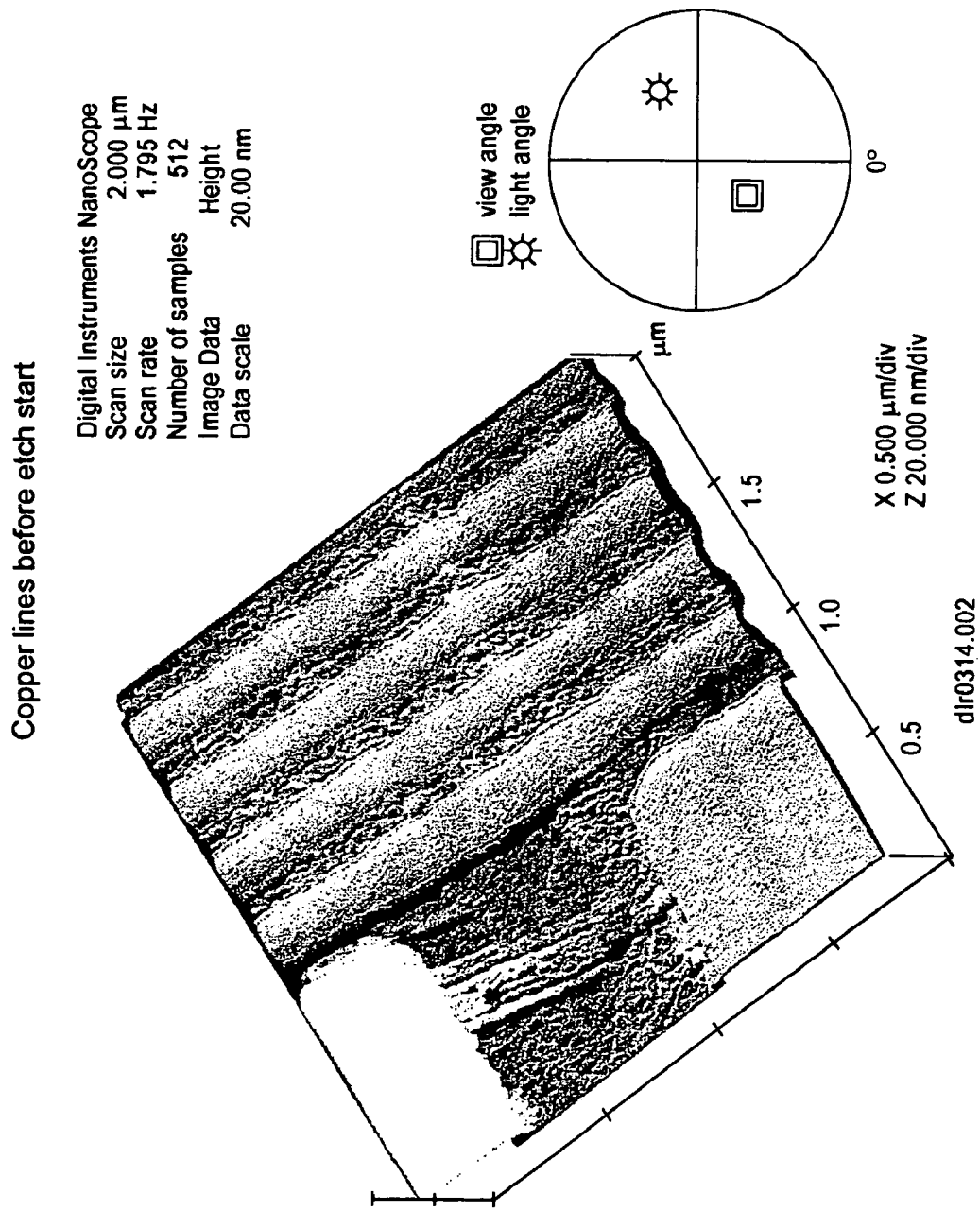
FIG. 4 is an AFM surface topograph of copper wires after cleaning with a deaerated IPA/HCl mixture to remove CMP contaminants.

FIG. 4 is the AFM after CMP and IPA/HCl clean. The dielectric has a smooth appearance and lighter shading; while the copper wires have texture and appear in darker shading showing the copper lying below the dielectric surface. The average depth of the copper 1 micron wires below the dielectric surface is about 6 nanometers. The AFM imaging of the 1 micron copper wires shows copper grains and some defects. The average depth of the copper 0.1 micron wires below the dielectric surface is about 4 nanometers. The copper roughness and depth below the dielectric is a typical result of CMP and IPA/HCl treatment.

Figure 5:
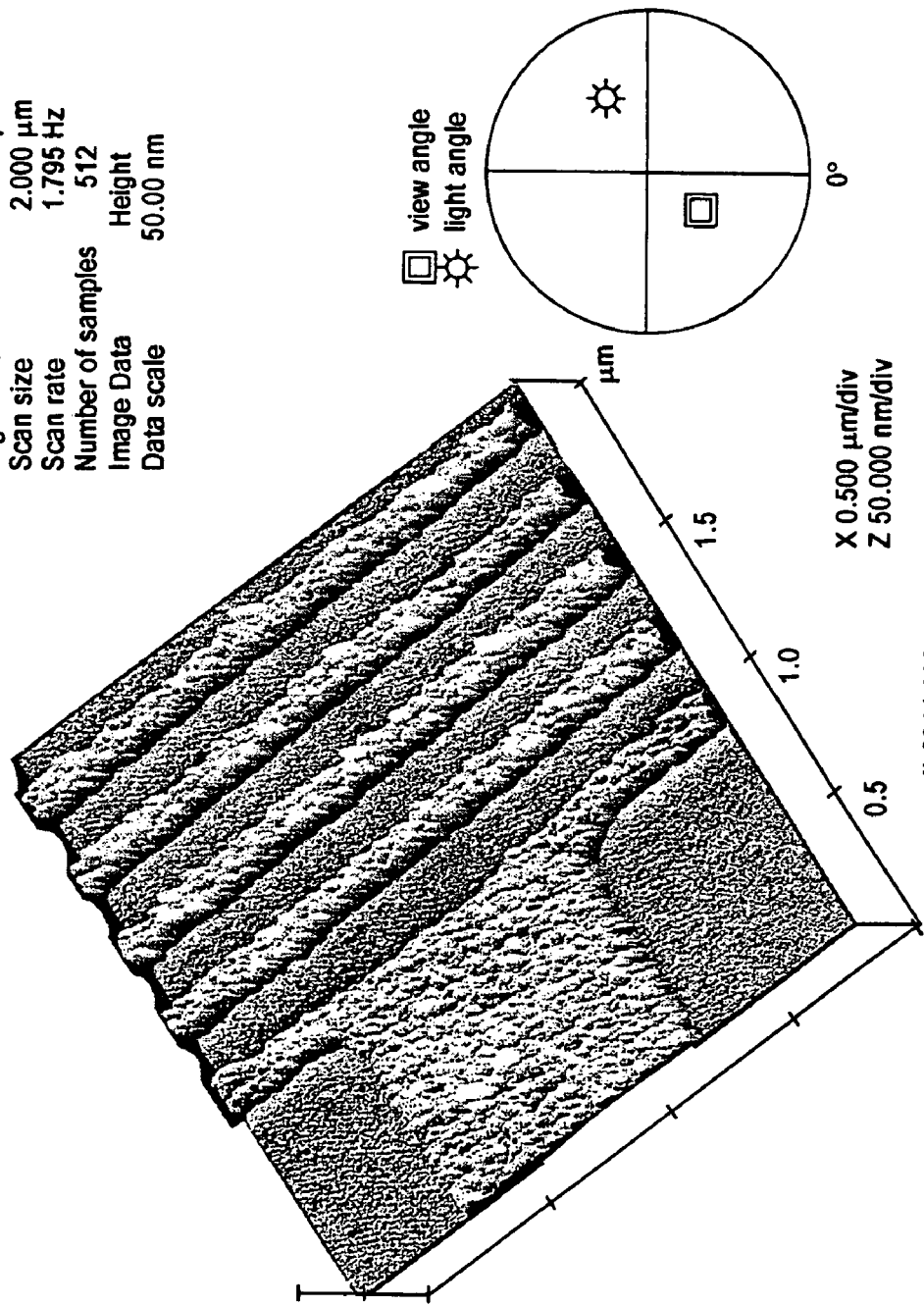
FIG. 5 is an AFM surface topograph of copper lines after the oxidizing etch step according to the present invention.

FIG. 5 is the AFM image taken after a 4 minute etch according to the present invention, on the same exact interconnect structure of FIG. 4, with the "hydrated copper oxide" inhibiting layer not yet removed (water rinsed and dried). The inhibiting layer on the copper wires is formed by the etch and extends above the dielectric by about 10 nanometers for both 1 micron and 0.1 micron wires (lighter shade in this image). The grain structure and defects of the copper in the 1 micron wire noted in FIG. 4 are not visible in FIG. 5.

Figure 6:
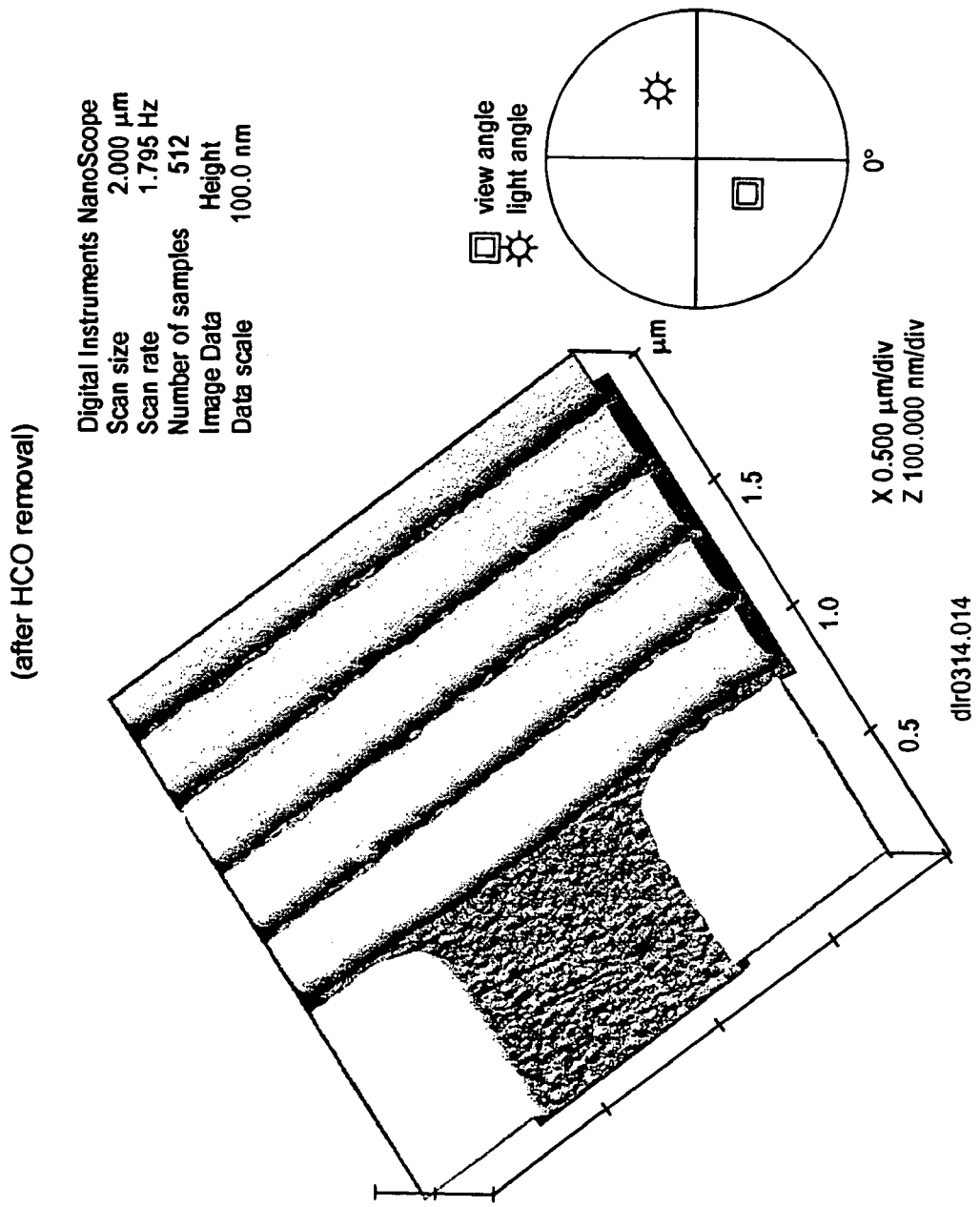
FIG. 6 is an AFM surface topograph of copper lines after removal of the oxidized layer according to the present invention.

FIG. 6 is the AFM image taken after the "hydrated copper oxide" inhibiting layer was removed with dilute acetic acid; on the same exact interconnect structure of FIG. 4. The average depth for both the 1 micron and the 0.1 micron wires below the dielectric surface was about 26 nanometers.

EXAMPLE 2

A substrate similar in type to the one used in Example 1, was cleaned as described above and then was etched for 8 minutes in the same etching solution as used in Example 1 and under the same conditions as above. The inhibiting layer was immediately removed by treating the sample for about 2 minutes with a nitrogen-deaerated mixture of 0.2 Molar sulfuric acid and 0.2 Molar acetic acid.

This example demonstrates the possibility of deeper recesses which in turn shows that the etch according to the present invention is not self limiting as is the known art. This example also demonstrates that the present invention makes possible smoother copper recesses than typical etchants as, for instance, exemplified in Example 3 below.

Figure 7:
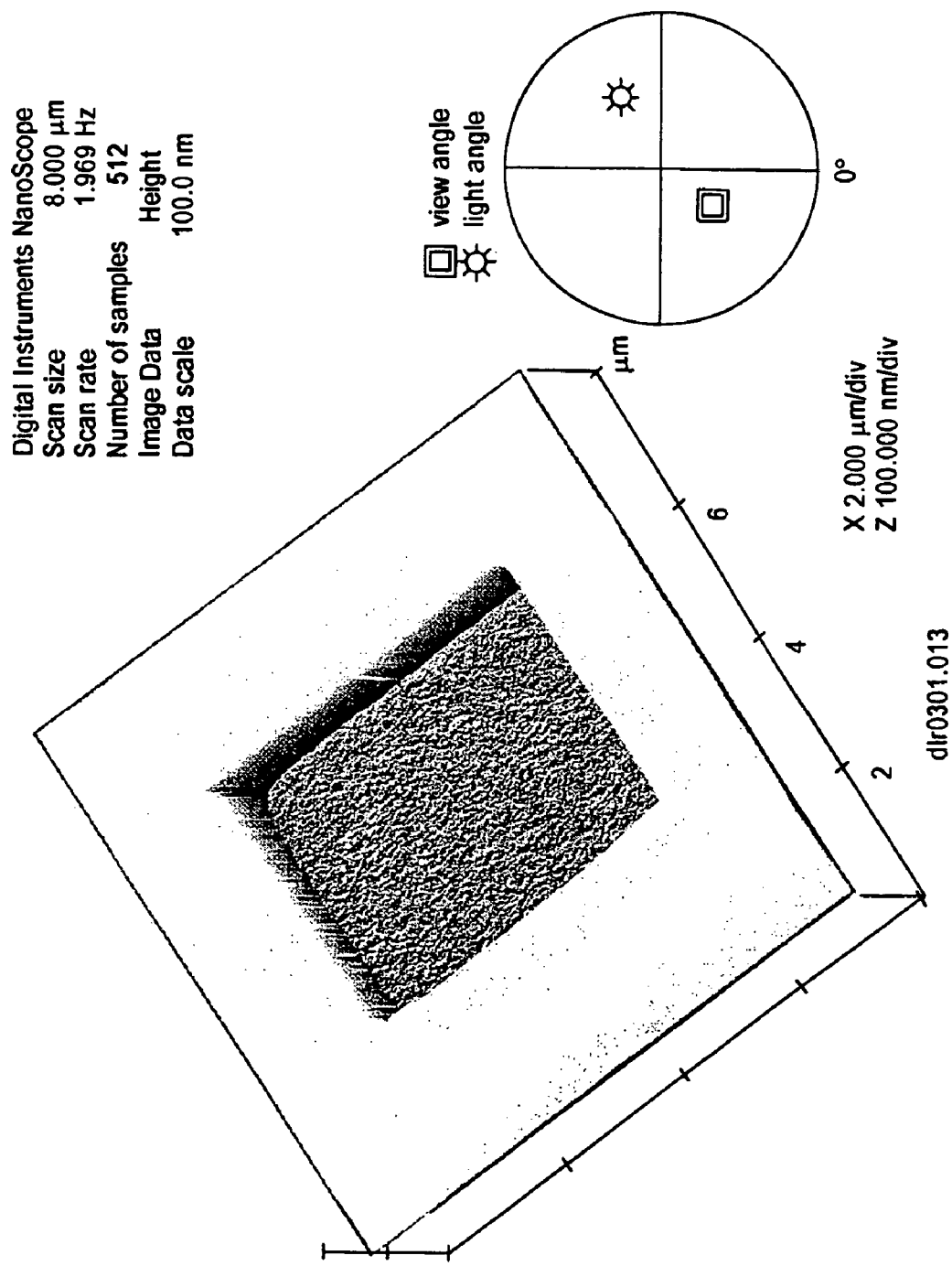
FIG. 7 is an AFM surface topograph of a copper pad after cleaning with a deaerated IPA/HCl mixture, followed by an oxidizing etch step according to the present invention and then removal of the oxidized layer according to the present invention.

The results are shown in FIG. 7. FIG. 7 is an AFM image of a 3×5 micron copper pad imbedded in a dielectric after processing with CMP and IPA/HCl clean, followed by an 8 minute etch according to the present invention and the as acid removal of the inhibiting layer. The average depth of the copper below the dielectric surface is about 52 nanometers, with a roughness about the same as obtained in the etch of example (see FIG. 6).

EXAMPLE 3

Figure 8:
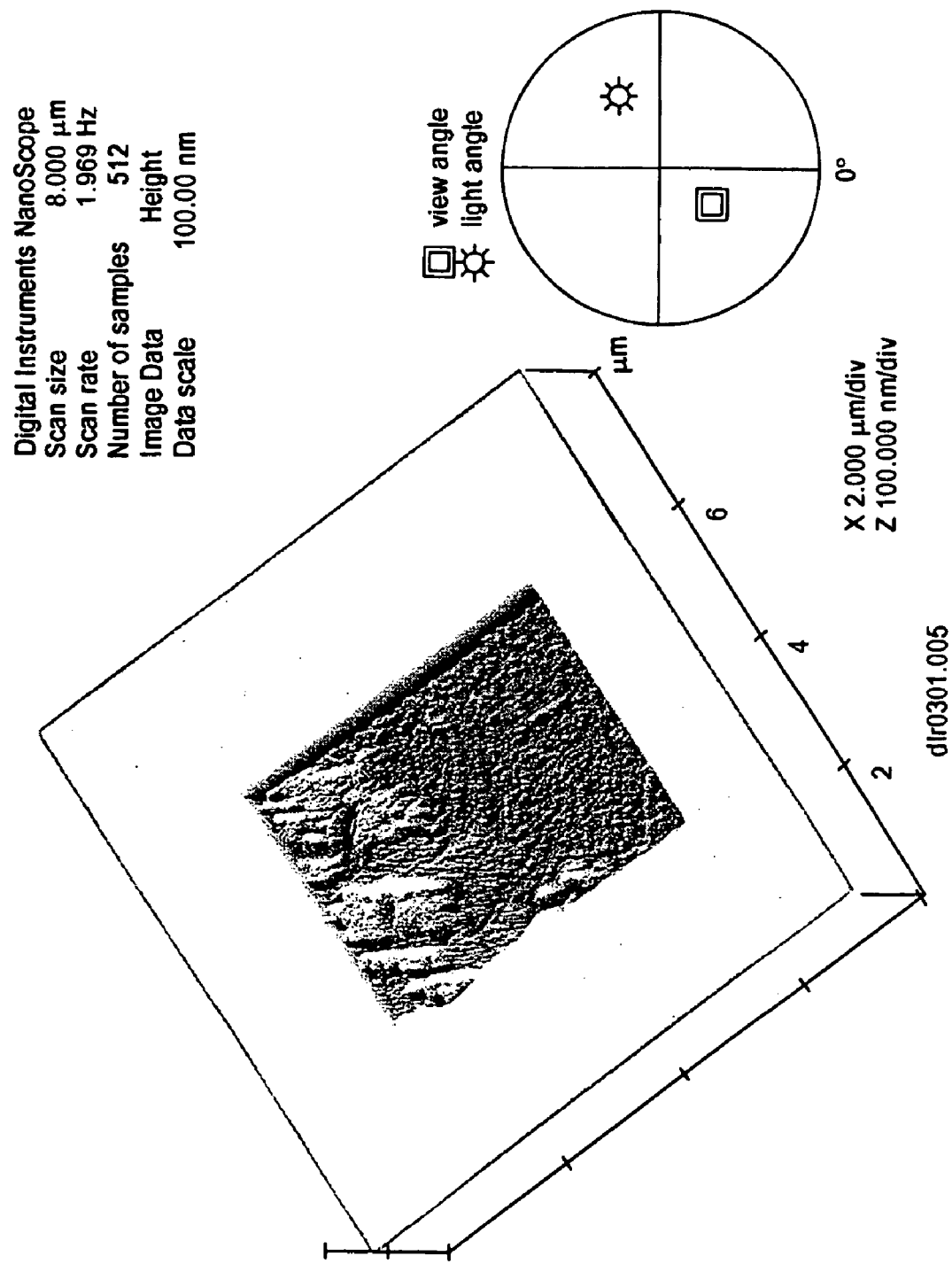
FIG. 8 is an AFM surface topograph of a copper pad after etching in an etchant outside the scope of this invention.

A sample similar in type to the one used in Example 2 was etched in a standard Cu etch ($H_2O:H_2O_2$ 30%: acetic acid 1000:3:5 v/v). The average depth of the copper below the dielectric surface is about 54 nanometers. Note the roughness that occurs due to the non-uniform copper removal (AFM surface topograph, FIG. 8) as compared to the smooth copper surface achieved by the present invention (see FIGS. 6 and 7).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concepts as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with various modifications required by the particular applications or uses of the invention. Accordingly, the description is not intended to limit the invention to the form disclosed herein. Also, it is intended that the appended claims be construed to include alternative embodiments. All publications and patent applications cited in this specification are herein incorporated by reference as if each individual publication or patent application were specifically and individually indicated to be incorporated by reference.

What is claimed is:

1. An aqueous etching composition having a pH of about 6 to about 12 and comprising about 0.5 to about 10 wt% of an oxidant; a mixture comprising at least one weak complexant for the copper or copper alloy having a cumulative stability constant with copper of $\leq 10^{14}$ and at least one strong complexant for the copper or copper alloy having a cumulative stability constant with copper of $\geq 10^{15}$, the amount of the at least one weak complexant is about 0.1 Molar to about 0.8 Molar, and the amount of the at least one strong complexant is about 0.001 to about 10 g/l; water; and which further comprises a non-oxidizing acid or salt thereof or a base.

2. The etching composition of claim 1 which comprises at least one peroxide compound and at least one weak complexant for copper or copper alloy selected from the group consisting of ammonia and an amine; and at least one strong complexant for the copper or copper alloy selected from the group consisting of an aminocarboxylate and an aminophosphonate; and has a basic pH.

3. The etching composition of claim 2 wherein the peroxide is selected from the group consisting of hydrogen peroxide, a peroxy carboxylate, perborate, and percarbonate, and mixtures thereof.

4. The etching composition of claim 3 wherein the at least one weak complexant is selected from the group consisting of ammonia, ethylamine, methylamine, tetramethylammonium hydroxide and 2-hydroxyethyl-trimethylammonium hydroxide; and the at least one strong complexant is selected from the group consisting of 1,2-cyclohexane diaminetetraacetic acid (CDTA), ethylene diamine tetraacetic acid (EDTA), triethylenetetraaminehexaacetic acid; diethylene triaminepentaacetic acid;, 2,2-dimethyl-1,3-diaminopropane-N,N,N',N'-tetraacetic acid; cis, cis,cis-3,5-dimethyl-1,2-diaminocyclopentane -N,N,N',N'-tetraacetic acid and cis-bicyclo (2.2.2) octane-2,3-diamine -N,N,N',N'-tetraacetic acid.

5. The etching composition of claim 1 wherein the oxidant comprises hydrogen peroxide and said weak complexant comprises ammonia.

6. The etching composition of claim 5 which comprises about 0.001-10 g/1 of 1,2-cyclohexane diaminotetraacetic acid, ethylene diamine tetraacetic acid or both.

7. The etching composition of claim 1 which comprises about 1.5 wt% hydrogen peroxide, about 0.5 wt% ammonia and about 0.5 g/1 of 1,2-cyclohexane-diaminotetraacetic acid.

8. The etching composition of claim 1 which comprises about 3 wt% hydrogen peroxide, about 0.5 wt% ammonia and about 0.5 g/1 of 1,2-cyclohexane diaminetetraacetic acid.

9. The etching composition of 1 wherein the non-oxidizing acid is selected from the group consisting of sulfuric acid, hydrochloric acid, acetic acid and methanesulfonic acid and mixtures thereof and said base is selected from the group consisting of sodium hydroxide, potassium hydroxide, and tetramethyl ammonium hydroxide and mixtures thereof.

10. The etching composition of claim 1 which comprises a deaerated non-oxidizing aqueous acid.

11. The etching composition of claim 1 wherein the amount of the at least one weak complexant is about 0.2 Molar to about 0.4 Molar.

12. The etching composition of claim 1 wherein said pH is a basic pH.

* * * * *